(12) United States Patent
Sung et al.

(10) Patent No.: US 9,356,231 B2
(45) Date of Patent: May 31, 2016

(54) MRAM DEVICE AND FABRICATION METHOD THEREOF

(71) Applicant: Taiwan Semiconductor Manufacturing Company, Ltd., Hsin-Chu (TW)

(72) Inventors: Fu-Ting Sung, Yangmei (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/561,058

(22) Filed: Dec. 4, 2014

(65) Prior Publication Data

US 2015/0147825 A1    May 28, 2015

Related U.S. Application Data

(62) Division of application No. 13/190,966, filed on Jul. 26, 2011, now Pat. No. 8,921,959.

(51) Int. Cl.
*H01L 43/12* (2006.01)
*H01L 43/08* (2006.01)

(52) U.S. Cl.
CPC ............... *H01L 43/12* (2013.01); *H01L 43/08* (2013.01)

(58) Field of Classification Search
CPC ....... H01L 43/12; H01L 43/08; H01L 27/222; H01L 27/228; H01L 41/12; H01L 43/02; H01L 43/10
USPC ...................... 438/3, 238, 240; 257/E29.323, 257/E43.006, 421, E21.001, E21.002, 257/E21.665, E27.005, E43.001, 422
See application file for complete search history.

(56) References Cited

U.S. PATENT DOCUMENTS

| | | | |
|---|---|---|---|
| 7,122,386 B1 * | 10/2006 | Torng | H01L 43/12 257/E27.005 |
| 2006/0276034 A1 | 12/2006 | Blanchard | |
| 2007/0048950 A1 | 3/2007 | Kanakasabapathy et al. | |
| 2008/0003701 A1 | 1/2008 | Chen et al. | |
| 2009/0085132 A1 | 4/2009 | Kao et al. | |
| 2009/0209050 A1 * | 8/2009 | Wang | H01L 43/12 438/3 |
| 2009/0261437 A1 * | 10/2009 | Kang | H01L 43/12 257/422 |
| 2010/0072566 A1 | 3/2010 | Kang et al. | |
| 2011/0049656 A1 * | 3/2011 | Li | G11C 11/16 257/421 |
| 2012/0205764 A1 | 8/2012 | Chen et al. | |
| 2013/0062714 A1 * | 3/2013 | Zhu | G11C 11/16 257/421 |

\* cited by examiner

*Primary Examiner* — Stephen W Smoot
*Assistant Examiner* — Edward Chin
(74) *Attorney, Agent, or Firm* — Slater Matsil, LLP

(57) ABSTRACT

According to an embodiment, a magnetoresistive random access memory (MRAM) device comprises a bottom electrode, a stack, a dielectric material, a dielectric layer, and a conductive material. The bottom electrode is over a substrate, and the stack is over the bottom electrode. The stack comprises a magnetic tunnel junction (MTJ) and a top electrode. The dielectric material is along a sidewall of the stack, and the dielectric material has a height greater than a thickness of the MTJ and less than a stack height. The dielectric layer is over the stack and the dielectric material. The conductive material extends through the dielectric layer to the top electrode of the stack.

20 Claims, 8 Drawing Sheets

MRAM DEVICE AND FABRICATION METHOD THEREOF

This application is a divisional of U.S. patent application Ser. No. 13/190,966, filed on Jul. 26, 2011, and entitled "MRAM Device and Fabrication Method Thereof," which is incorporated herein by reference in their entireties.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely magnetoresistive random access memory (MRAM) devices. Other embodiments may also be applied, however, to other semiconductor structures.

Figure 1:
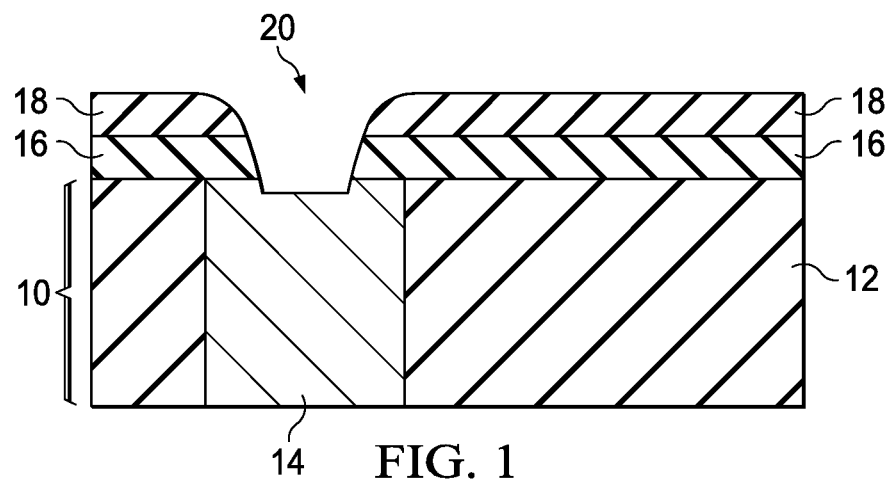
FIGS. 1 through 9 are a first embodiment to form an MRAM device.

FIGS. 1 through 9 illustrate a first embodiment to form an MRAM device. FIG. 1 shows a cross-section view of a structure during manufacture of an MRAM device. FIG. 1 illustrates a substrate 10. The substrate 10 includes an inter-metal dielectric (IMD) layer 12 with a metallization pattern 14. The IMD layer 12 may be an extra low-k dielectric (ELK) layer, such as carbon doped silicon dioxide, may be an oxide, such as silicon oxide, and/or may be the like or a combination thereof. The metallization pattern 14 may be copper, aluminum, the like, and/or a combination thereof. The substrate may also include active and passive devices, for example, underlying the IMD layer 12. These further components are omitted from the figures for clarity, and how these components are formed will be readily apparent to a person having ordinary skill in the art.

FIG. 1 further shows a first dielectric layer 16 formed over the substrate 10 and a second dielectric layer 18 formed over the first dielectric layer 16. In other embodiments, only one dielectric layer is used, or further dielectric layers are used. The first dielectric layer 16 in this example is silicon carbide (SiC). In other embodiments, the first dielectric layer 16 may be silicon oxynitride (SiON), the like, and/or a combination thereof. The second dielectric layer 18 is silicon nitride (SiN) in this embodiment. In other embodiments, the second dielectric layer 18 may be silicon dioxide ($SiO_2$), the like, and/or a combination thereof. Further, the first dielectric layer 16 and the second dielectric layer 18 may be the same or different materials and/or compositions. Each of the first dielectric layer 16 and the second dielectric layer 18 may be formed by acceptable deposition techniques, such as chemical vapor deposition (CVD), atomic layer deposition (ALD), physical vapor deposition (PVD), the like, and/or a combination thereof.

An opening 20 is formed through the first dielectric layer 16 and the second dielectric layer 18 to expose a portion of the metallization pattern 14. The opening may be formed using acceptable lithography techniques, such as by an anisotropic etch.

Figure 2:
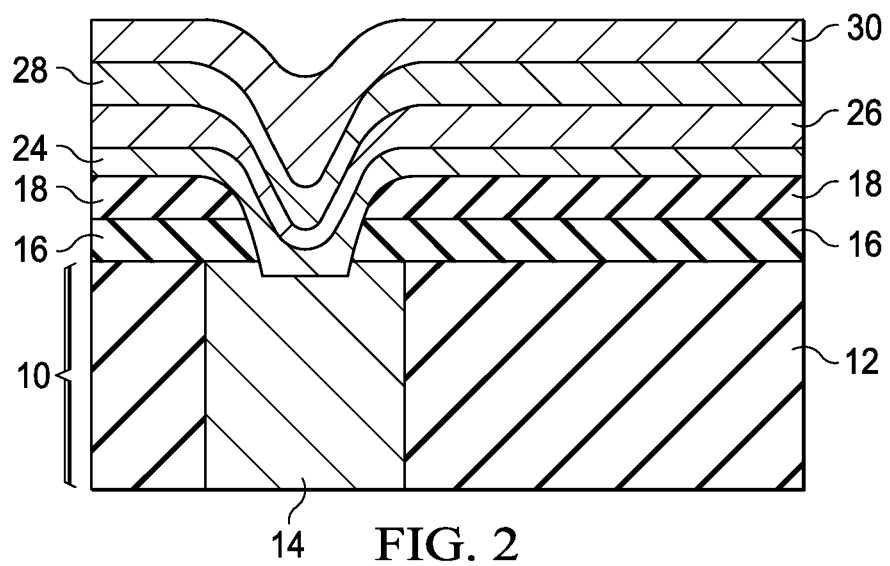

FIG. 2 illustrates the formation of a bottom electrode layer 24, a magnetic tunnel junction (MTJ) layer(s) 26, a first top electrode layer 28, and a second top electrode layer 30. Each layer is formed conformally over the substrate 10, such as over the second dielectric layer 18 and within and along sidewalls of the opening 20. The layers are also formed sequentially. The bottom electrode layer 24 is formed over the second dielectric layer 18. Then, the MTJ layer(s) 26 is formed over the bottom electrode layer 24, and next, the first top electrode layer 28 is formed followed by the formation of the second top electrode layer 30. Each of the bottom electrode layer 24, the first top electrode layer 28, and the second top electrode layer 30 may be copper, aluminum, tantalum, tungsten, tantalum nitride (TaN), titanium, titanium nitride (TiN), the like, and/or a combination thereof. Each of the bottom electrode layer 24, the first top electrode layer 28, and the second top electrode layer 30 may be formed by CVD, PVD, ALD, the like, and/or a combination thereof. It is worth noting that only one top electrode layer or more than two top electrode layers may be used, and the use of two in this embodiment is merely as an example. Further, the two top electrode layers 28 and 30 may be the same or different materials and/or compositions.

The MTJ layer(s) 26 may include various layers formed of different combinations of materials. In an exemplary embodiment, MTJ layer(s) 26 include a pinning layer, a tunnel barrier layer, and a free layer. In addition, MTJ layer(s) 26 may have other variations including other layers, such as anti-ferromagnetic layers. In an exemplary embodiment, the pinning layer is formed of PtMn, tunnel barrier layer is formed of MgO, and free layer is formed of CoFeB. The magnetic moment of free layer may be programmed causing the resistance of the resulting MTJ cell to be changed between a high resistance and a low resistance. It is realized that MTJ layer(s) 26 may have many variations, which are also within the scope of the present disclosure.

Figure 3:
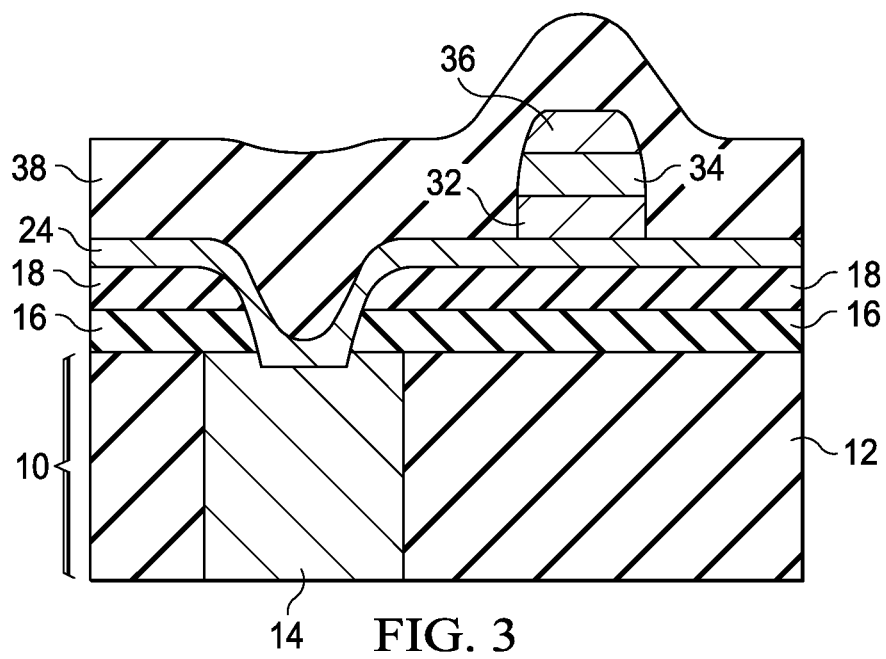

In FIG. 3, the MTJ layer(s) 26, the first top electrode layer 28, and the second top electrode layer 30 are etched to form a MTJ 32 having a width $W_1$ (see FIG. 9), a first top electrode 34, and a second top electrode 36, such as in a stack. The MTJ 32, first top electrode 34, and second top electrode 36 form part of a MRAM device. The layers may be etched using acceptable photolithography techniques. A spacer layer 38 is formed over the exposed portions of the bottom electrode layer 24, over sidewalls of the MTJ 32, first top electrode 34, and second top electrode 36, and over the second top electrode 36. The spacer layer 38 in this example is SiN, but in other embodiments may be SiC, SiON, silicon oxycarbide (SiOC), the like, and/or a combination thereof. The spacer layer 38 may be formed using CVD, PVD, ALD, the like, and/or a combination thereof.

Figure 4:
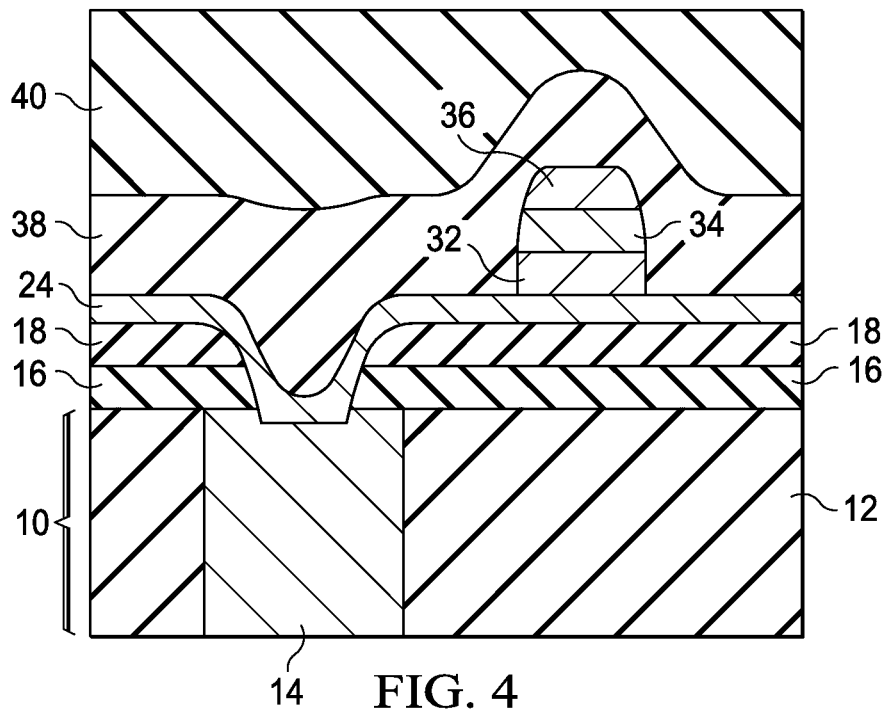

In FIG. 4, an anti-reflective coating (ARC) layer 40 is formed over the spacer layer 38. The ARC layer 40 in this example is a bottom ARC layer and is an organic material, such as $C_xH_xO_x$. The ARC layer 40 may also be silicon oxynitride, silicon nitride, the like, and/or a combination thereof. The ARC layer 40 may be formed using CVD, ALD, PVD, the like, and/or a combination thereof.

Figure 5:
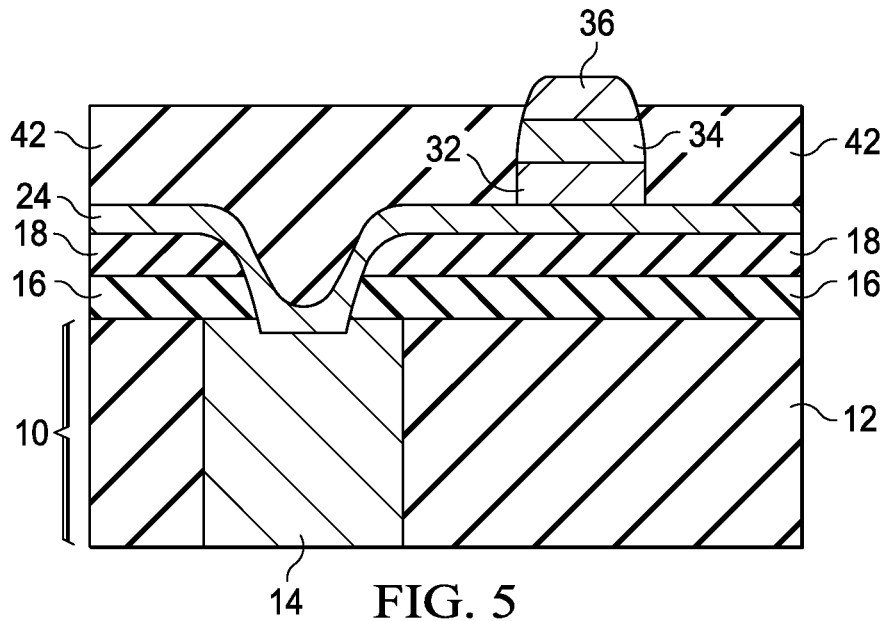

FIG. 5 shows the structure after planarization and etchback. The ARC layer 40 and portions of the spacer layer 38 are removed, for example, by a chemical mechanical polish (CMP) followed by an etch-back selective to the materials of the ARC layer 40 and the spacer layer 38. The CMP may polish the ARC layer 40 and the spacer layer 38 to a top surface of the second top electrode 36. Then, the etch-back may etch the remaining ARC layer 40 and portions of the spacer layer 38 to a height less than the height of the second top electrode 36 such that the second top electrode 36 protrudes from the resulting buffer 42. The buffer 42 may have a top surface that is higher than an interface between the MTJ 32 and the first top electrode 34, and in this example, the buffer 42 has a top surface that is higher than an interface between the first top electrode 34 and the second top electrode 36. It is worth noting that the planarization may be by any combination of CMP, etching, or the like. For example, only an etch-back is used in another embodiment.

Figure 6:
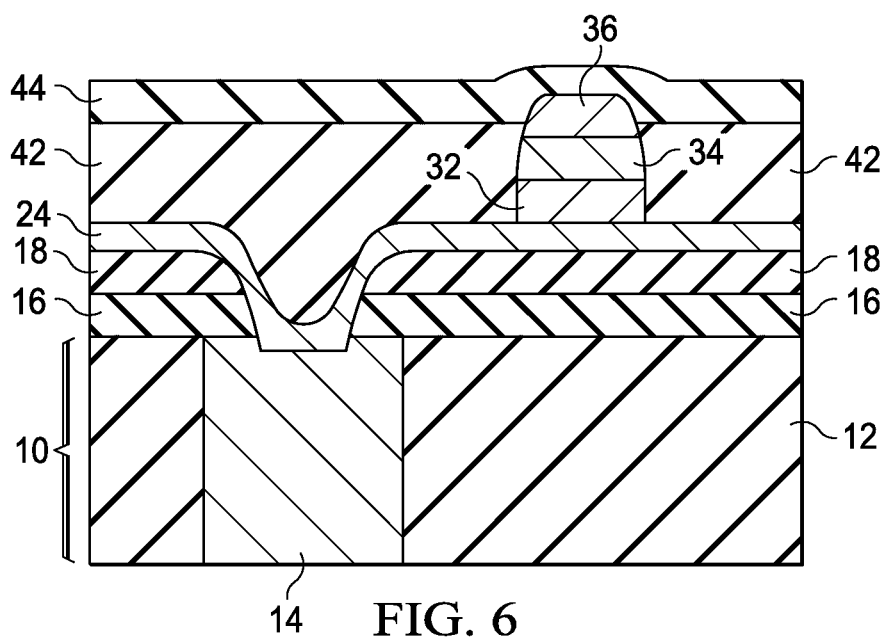

FIG. 6 depicts the formation of a capping layer 44, which may also act as an etch stop layer, over the buffer 42 and the second top electrode 36. In this embodiment, the capping layer 44 is SiC, but in other embodiments, the capping layer 44 may be SiC, SiN, SiON, the like, and/or a combination thereof. The capping layer 44 may be formed by CVD, PVD, ALD, the like, and/or a combination thereof.

Figure 7:
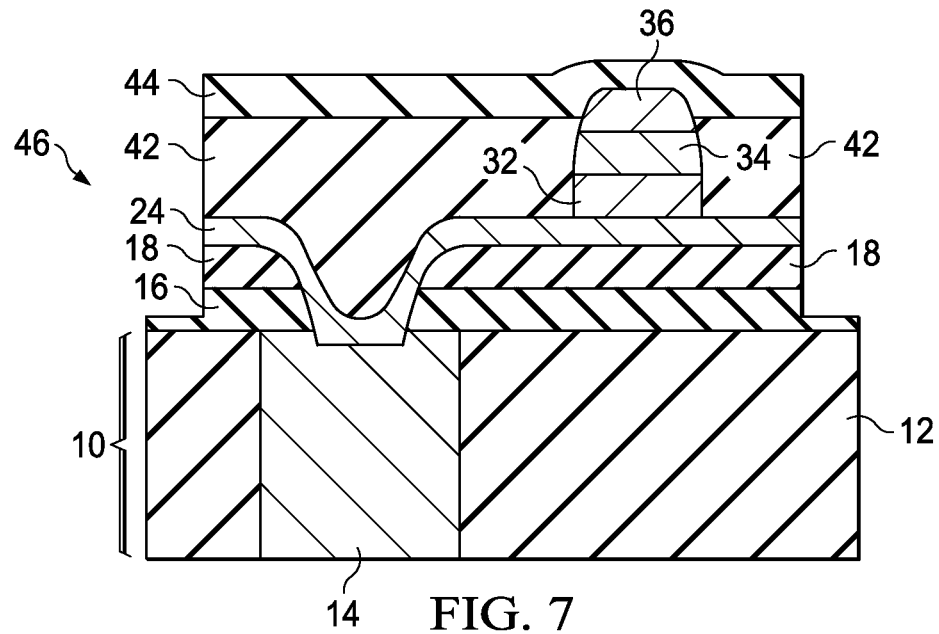

In FIG. 7, lateral portions 46 of the capping layer 44, the buffer 42, the bottom electrode layer 24, and the second dielectric layer 18 are etched to the first dielectric layer 16. This etching removes portions of the bottom electrode layer 24 that would otherwise form an electrical connection between other MRAM cells within an array. The etching results in individual MRAM cells. The etching may be performed by acceptable photolithography technique, such as by using an anisotropic etch.

Figure 8:
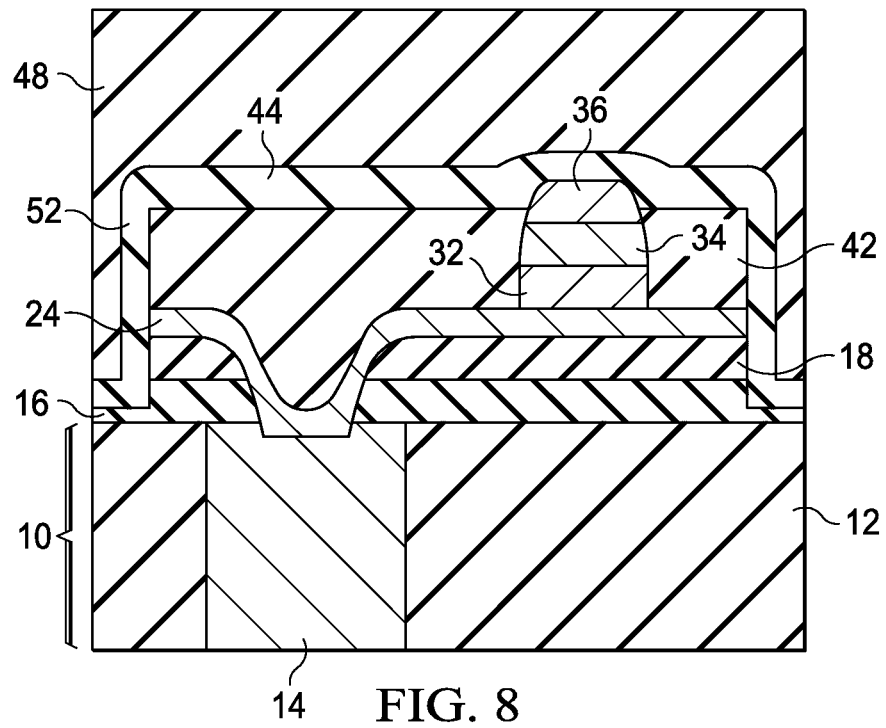

FIG. 8 shows the further formation of the capping layer 44 by forming sidewall capping portions 52 and the formation of an overlying dielectric layer 48. The sidewall capping portions 52 are formed in the in the areas of the removed lateral portions 46. The formation of the sidewall capping portions may be by CVD, ALD, PVD, the like, and/or a combination thereof. In this embodiment, the sidewall capping portions 52 are the same material as the capping layer 44, and as such, the formation of the sidewall capping portions 52 may cause the capping layer 44 to become thicker. In other embodiments, if the sidewall capping portions 52 are a different material, the sidewall capping portions 52 may form a different layer over the capping layer 44. The overlying dielectric layer 48 is formed over the sidewall capping portions 52 and the capping layer 44 and may be an inter-layer dielectric (ILD) layer or an IMD layer. The overlying dielectric layer 48 may be an extra low-k dielectric (ELK) layer, such as carbon doped silicon dioxide, may be an oxide, such as silicon oxide, and/or may be the like or a combination thereof. The overlying dielectric layer 48 may be formed using CVD, PVD, ALD, the like, and/or a combination thereof. After being deposited, the overlying dielectric layer 48 may be planarized, such as by CMP.

Figure 9:
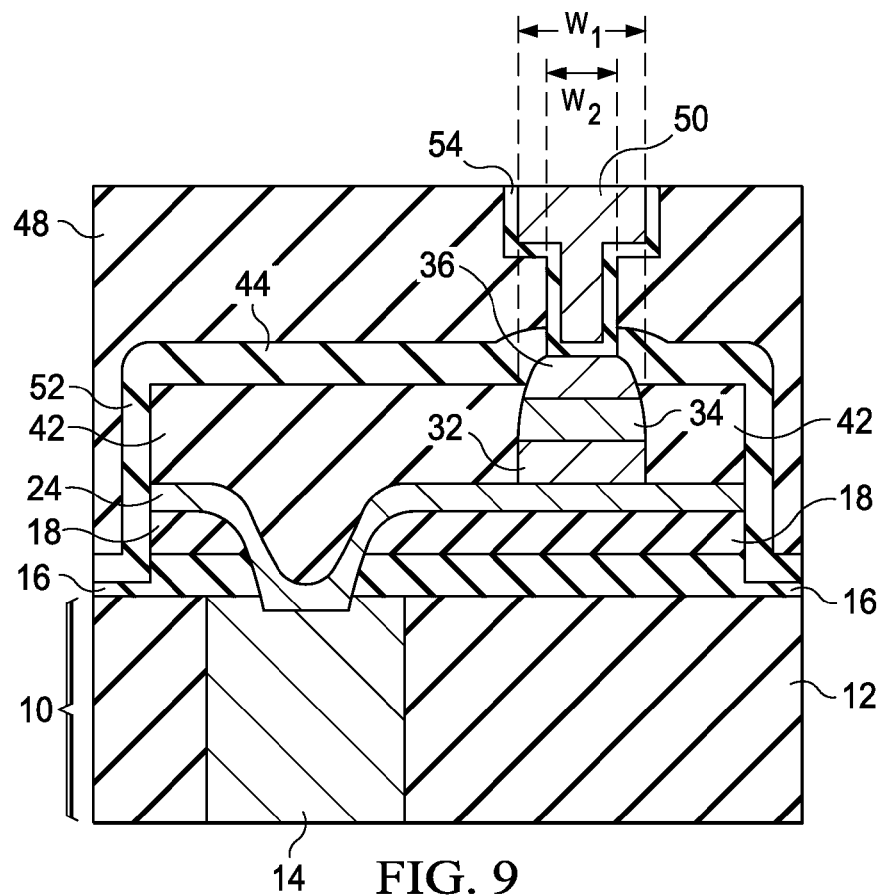

In FIG. 9, an opening is etched through the overlying dielectric layer 48 and the capping layer 44 to the second top electrode 36. The opening may be etched using an acceptable photolithography technique, such as a single or dual damascene process. A conductive material 50 is formed in the opening and includes a metallization pattern portion and a via portion having a width $W_2$ between the metallization pattern portion and the second top electrode 36. The conductive material 50, such as a metal and alloys, may be deposited in the opening to form a via and a metallization. A thin barrier layer 54 may also be deposited between the conductive material and the overlying dielectric layer 48. The details for forming the metallization and via are well known in the art, and as such, are omitted herein for brevity.

Figure 10:
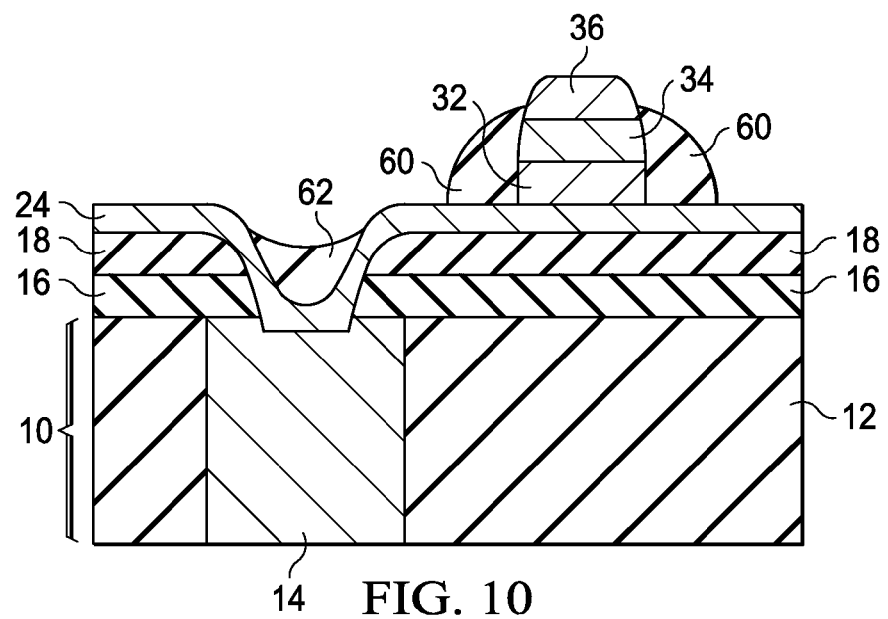
FIGS. 10 through 14 are a second embodiment to form an MRAM device.

FIGS. 10 through 14 illustrate a second embodiment to form an MRAM device. The structure of FIG. 10 is first processed through the steps discussed with respect to FIGS. 1 through 3. In FIG. 10, the spacer layer 38 is etched to form a spacer 60. A portion 62 of the spacer layer 38 may remain in the opening 20. The etching may be by an anisotropic etch using acceptable photolithography techniques. A portion of the spacer 60 directly adjoins the MTJ 32, the first top electrode 34, and part of the second top electrode 36. In other embodiments, the spacer 60 has a height in a part that directly adjoins the MTJ 32 that is greater than a height of the MTJ 32 or has a height that is above the interface of the MTJ 32 and the first top electrode 34. A portion of the second top electrode 36 is exposed from the spacers 60. In this embodiment, the spacer 60 is formed around and encloses the MTJ 32. In other embodiments, separate spacers may be formed at various parts along the MTJ 32 and may not fully enclose the MTJ 32.

Figure 11:
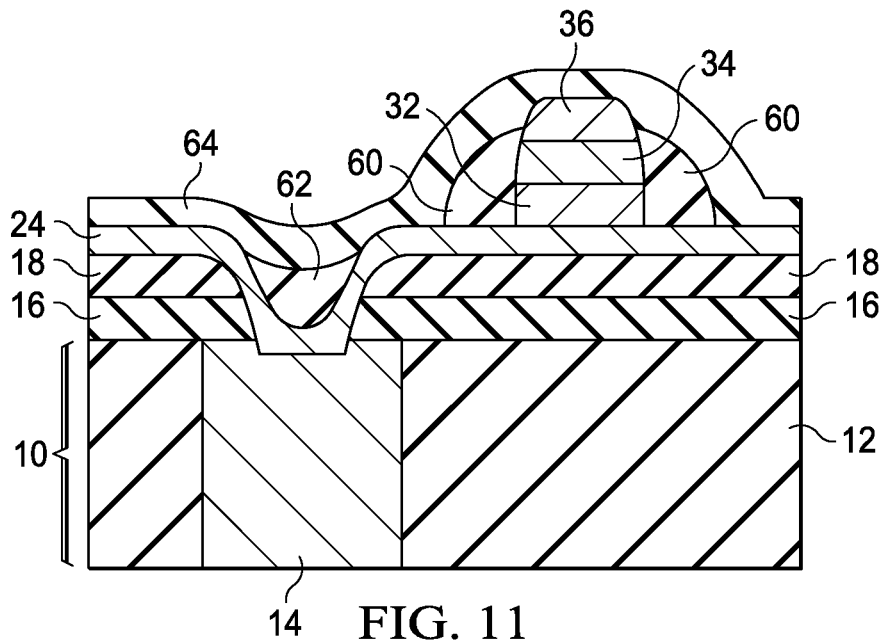
Figure 12:
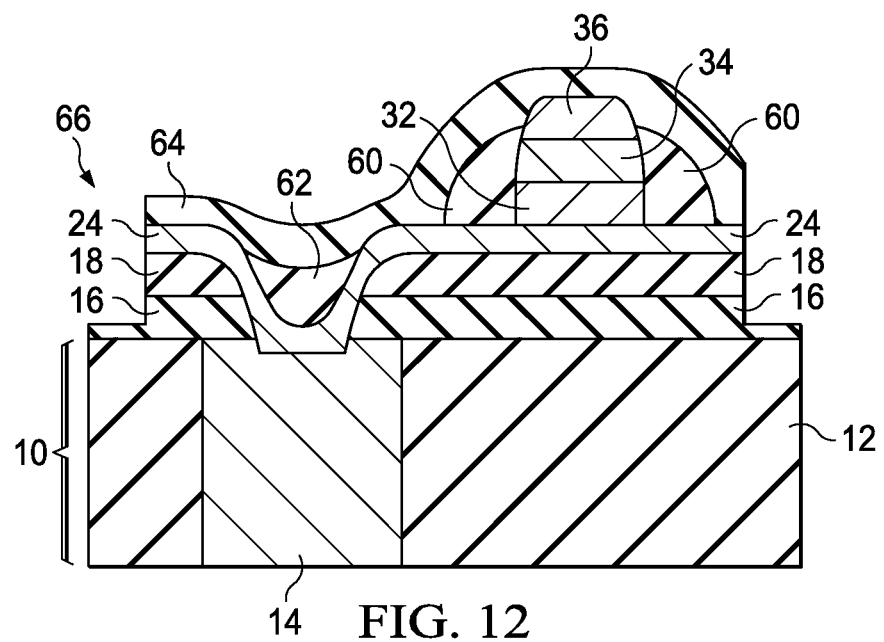
Figure 13:
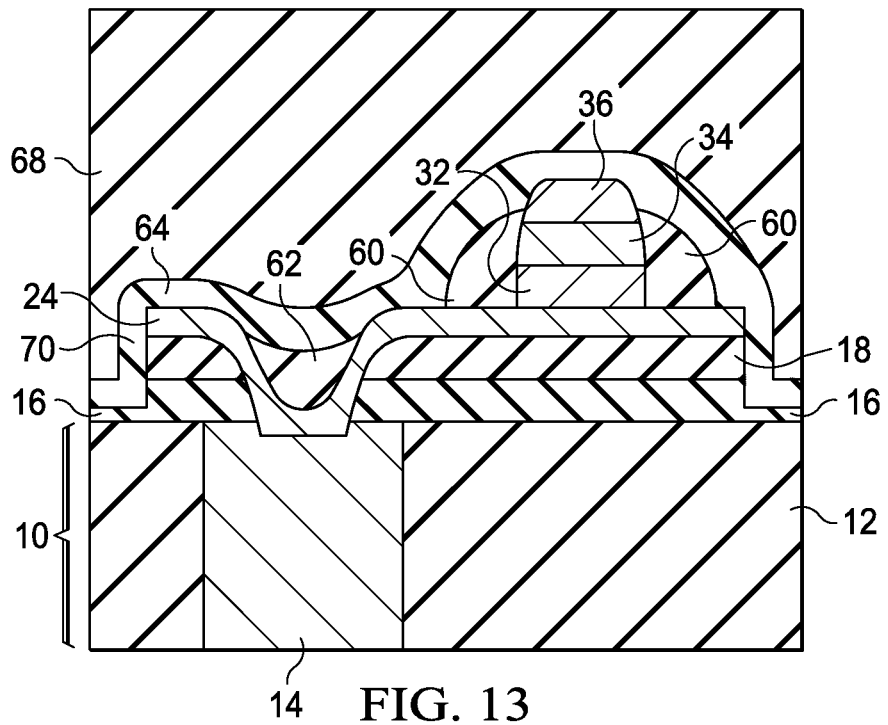
Figure 14:
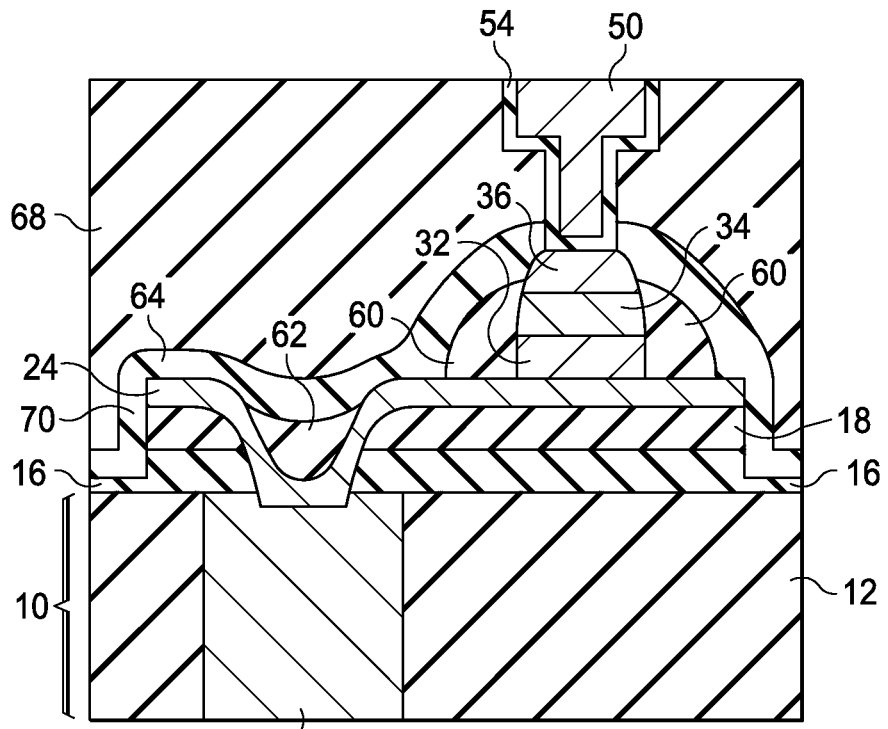

In FIG. 11, a capping layer 64 is formed over the second top electrode 36 and the spacer 60 similar to the capping layer 44 in FIG. 6. In FIG. 12, lateral portions 66 of the capping layer 64, the bottom electrode layer 24, and the second dielectric layer 18 are etched to the first dielectric layer 16, similar to what is performed in FIG. 7. In FIG. 13, sidewall capping portions 70 and an overlying dielectric layer 68 is formed similarly to the sidewall capping portions 52 and the overlying dielectric layer 48 in FIG. 8. In FIG. 14, the opening is formed in the overlying dielectric layer 68, and the thin barrier layer 54 and conductive material 50 are formed in the opening, similar to FIG. 9.

Figure 15:
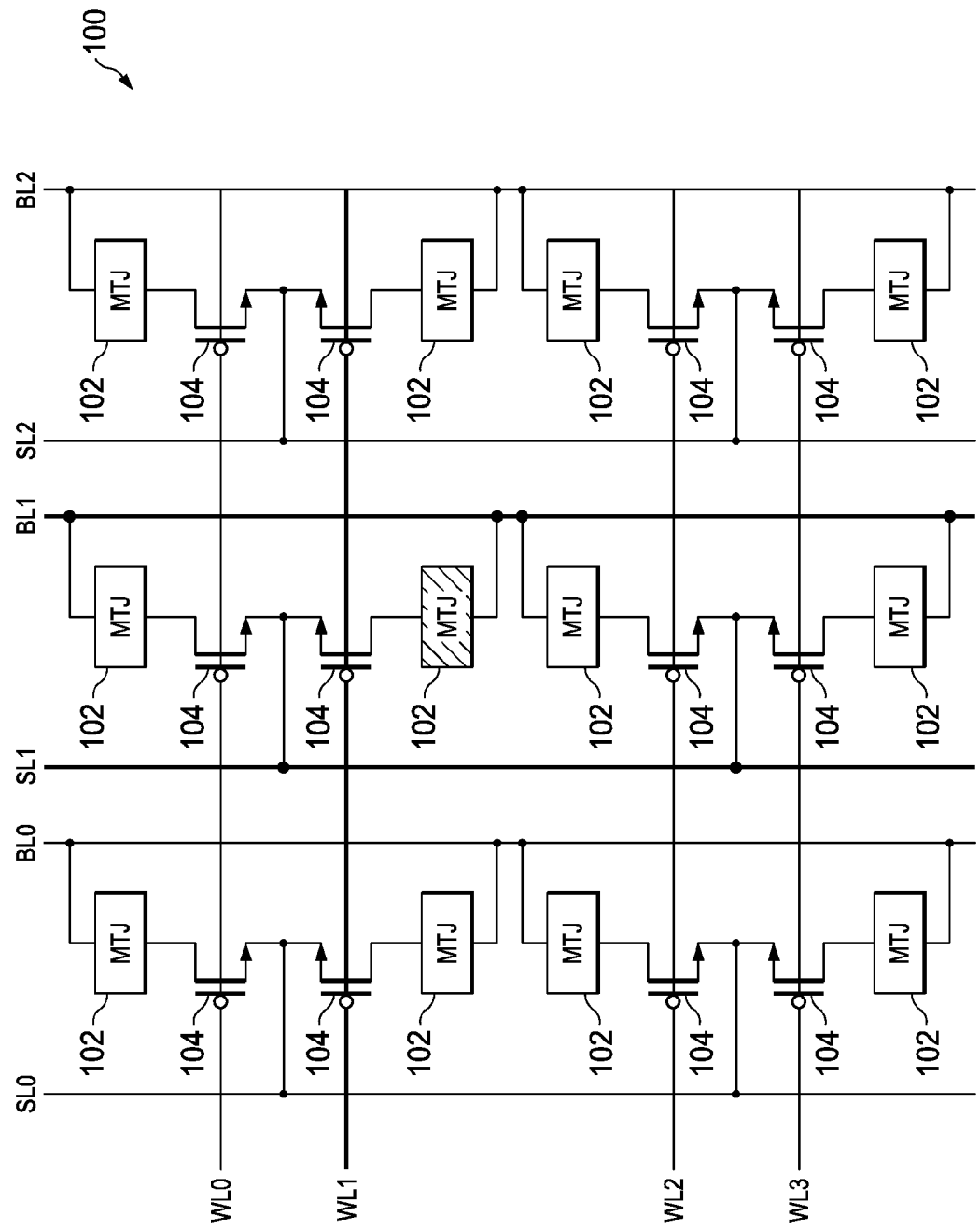
FIG. 15 is a MRAM array comprising structures of embodiments.

FIG. 15 illustrates a MRAM array 100 comprising structures of embodiments. MTJ cells 102, such as the stacks of the MTJ 32, the first top electrode 34, and the second top electrode 36, are arranged as array 100 having columns and rows. Each of the MTJ cells 102 is connected between one of the bit lines BL (referred to as BL0, BL1, . . . and the like) and one of the source lines SL (referred to as SL0, SL1, . . . and the like). Select transistor 104 is controlled by one of word lines WL (referred to as WL0, WL1, . . . and the like). The write currents of MTJ cells 102 are applied between the bit lines BL and the source lines SL. Word lines WL also control which one of the MTJ cells 102 is operated.

Embodiments may realize advantages. First, by having a buffer 42 or a spacer 60, an overlay window may be increased and MTJ program failure can be avoided. Further, the buffer 42 or spacer 60 may increase the strength and protection of the MTJ sidewall. Also, the process may be simplified, such as the process to form the top electrode and by reducing the number of layers formed for the structure.

According to an embodiment, a magnetoresistive random access memory (MRAM) device comprises a bottom electrode, a stack, a dielectric material, a dielectric layer, and a conductive material. The bottom electrode is over a substrate, and the stack is over the bottom electrode. The stack comprises a magnetic tunnel junction (MTJ) and a top electrode. The dielectric material is along a sidewall of the stack, and the dielectric material has a height greater than a thickness of the MTJ and less than a stack height. The dielectric layer is over the stack and the dielectric material. The conductive material extends through the dielectric layer to the top electrode of the stack.

Another embodiment a MRAM device. The MRAM device comprises a bottom electrode over a substrate, a magnetic tunnel junction (MTJ) over the bottom electrode, a top electrode over and having an interface with the MTJ, a dielectric material along a sidewall of the MTJ, a dielectric layer over the top surface of the top electrode and the dielectric material, and a via extending through the dielectric layer to the top electrode. The dielectric material has a height greater than the interface of the top electrode and the MTJ and less than a top surface of the top electrode.

A further embodiment is a method for forming a MRAM device. The method comprises forming a bottom electrode layer on a substrate; forming magnetic tunnel junction (MTJ) layers over the bottom electrode layer; forming a top electrode layer over the MTJ layers; removing portions of the MTJ layers and the top electrode layer to form a stack; forming a first dielectric layer over the stack; and removing a portion of the first dielectric layer. The stack comprises remaining portions of the MTJ layers and the top electrode layer, and the stack has a sidewall. A remaining portion of the first dielectric layer adjoins the sidewall of the stack, and the remaining portion of the first dielectric layer has a height above a thickness of the MTJ layers and below a thickness of the stack.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a magnetoresistive random access memory (MRAM) device, the method comprising:
    forming a bottom electrode layer on a substrate;
    forming magnetic tunnel junction (MTJ) layers over the bottom electrode layer;
    forming a top electrode layer over the MTJ layers;
    removing portions of the MTJ layers and the top electrode layer to form a stack, the stack comprising remaining portions of the MTJ layers and the top electrode layer, the stack having a sidewall;
    forming a first dielectric layer over the stack;
    removing a portion of the first dielectric layer, a remaining portion of the first dielectric layer adjoining the sidewall of the stack, the remaining portion of the first dielectric layer having a height above a thickness of the MTJ layers and below a thickness of the stack;
    forming a first capping layer over the stack and the remaining portion of the first dielectric layer; and
    removing lateral portions of the first capping layer and the first dielectric layer to expose sidewalls of the first dielectric layer and the bottom electrode layer.

2. The method of claim 1, wherein the removing the portion of the first dielectric layer comprises planarizing the first dielectric layer to the height.

3. The method of claim 1, wherein the removing the portion of the first dielectric layer comprises etching the first dielectric layer to form a spacer adjoining the sidewall of the stack, the portion of the first dielectric layer being laterally disposed from the spacer.

4. The method of claim 1, wherein forming the top electrode layer comprises forming a first top electrode layer and a second top electrode layer over the first top electrode layer, the second top electrode layer comprising a material different from the top electrode layer.

5. The method of claim 1 further comprising:
    forming a second capping layer on exposed sidewalls of the first dielectric layer and the bottom electrode layer.

6. The method of claim 5, wherein the first capping layer and the second capping layer have a same material composition.

7. The method of claim 5, wherein:
    the forming the first capping layer further comprises conformally forming the first capping layer; and
    the forming the second capping layer further comprises conformally forming the second capping layer.

8. The method of claim 1 further comprising:
    forming a second dielectric layer over the remaining portion of the first dielectric layer and the stack;
    etching an opening through the second dielectric layer to the top electrode layer of the stack; and
    forming a conductive material in the opening.

9. The method of claim 1, wherein the first capping layer comprises a middle portion and lateral portion, the middle portion overlying the stack, and the lateral portions being on opposite sides of the middle portion.

10. A method for forming a magnetoresistive random access memory (MRAM) device, the method comprising:
    forming a bottom electrode layer on a substrate;
    forming magnetic tunnel junction (MTJ) layers over the bottom electrode layer;
    forming a top electrode layer over the MTJ layers;
    removing portions of the MTJ layers and the top electrode layer to form a stack, the stack comprising remaining portions of the MTJ layers and the top electrode layer;
    forming a first dielectric layer over the bottom electrode layer and adjoining a sidewall of the stack, the first dielectric layer having a height above a thickness of the MTJ layers and below a thickness of the stack, the forming the first dielectric layer over the bottom electrode layer further comprising:
        forming the first dielectric layer over bottom electrode and the stack; and
        removing a portion of the first dielectric layer, a remaining portion of the first dielectric layer adjoining the sidewall of the stack and having the height;
    forming a first capping layer over the stack and the first dielectric layer;

removing lateral portions of the first capping layer; and
forming a second capping layer on sidewalls of the bottom electrode.

11. The method of claim 10, wherein the removing the portion of the first dielectric layer comprises planarizing the first dielectric layer to the height.

12. The method of claim 10, wherein the removing the portion of the first dielectric layer comprises etching the first dielectric layer to form a spacer adjoining the sidewall of the stack, the portion of the first dielectric layer being laterally disposed from the spacer.

13. The method of claim 10, wherein the first capping layer and the second capping layer have a same material composition.

14. The method of claim 10 further comprising:
    forming a second dielectric layer over the first dielectric layer and the stack;
    etching an opening through the second dielectric layer to the top electrode layer of the stack; and
    forming a conductive material in the opening, the conductive material having an upper portion that is wider than a lower portion.

15. The method of claim 10, wherein forming the top electrode layer comprises forming a first top electrode layer and a second top electrode layer over the first top electrode layer, the second top electrode layer comprising a material different from the top electrode layer.

16. The method of claim 10, wherein:
    the forming the first capping layer further comprises conformally forming the first capping layer; and
    the forming the second capping layer further comprises conformally forming the second capping layer.

17. A method for forming a magnetoresistive random access memory (MRAM) device, the method comprising:
    forming a bottom electrode layer on a substrate;
    forming a stack over the bottom electrode layer, the stack comprising magnetic tunnel junction (MTJ) layers over the bottom electrode layer and a top electrode layer over the MTJ layers;
    forming a first dielectric layer over the bottom electrode layer and adjoining a sidewall of the stack, the first dielectric layer having a height above a thickness of the MTJ layers and below a thickness of the stack;
    conformally forming a first capping layer over the stack and the first dielectric layer;
    removing lateral portions of the first capping layer to expose sidewalls of the bottom electrode layer; and
    conformally forming a second capping layer on the exposed sidewalls of the bottom electrode layer.

18. The method of claim 17, wherein the forming the first dielectric layer over the bottom electrode layer further comprises:
    forming the first dielectric layer over bottom electrode and the stack; and
    planarizing the first dielectric layer to the height.

19. The method of claim 17, wherein the forming the first dielectric layer over the bottom electrode layer further comprises:
    forming the first dielectric layer over bottom electrode and the stack; and
    etching the first dielectric layer to form a spacer adjoining the sidewall of the stack.

20. The method of claim 17, wherein the first capping layer and the second capping layer have a same material composition.

* * * * *